(12) United States Patent
Noda et al.

(10) Patent No.: US 10,389,086 B2
(45) Date of Patent: Aug. 20, 2019

(54) TWO-DIMENSIONAL PHOTONIC-CRYSTAL SURFACE-EMITTING LASER

(71) Applicants: KYOTO UNIVERSITY, Kyoto-shi, Kyoto (JP); ROHM CO., LTD., Kyoto-shi, Kyoto (JP); HAMAMATSU PHOTONICS K.K., Hamamatsu-shi, Shizuoka (JP); MITSUBISHI ELECTRIC CORPORATION, Tokyo (JP)

(72) Inventors: Susumu Noda, Kyoto (JP); Hitoshi Kitagawa, Kyoto (JP); Yoshinori Tanaka, Kyoto (JP)

(73) Assignees: KYOTO UNIVERSITY, Kyoto (JP); ROHM CO., LTD., Kyoto (JP); HAMAMATSU PHOTONICS K.K., Hamamatsu (JP); MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/754,932

(22) PCT Filed: Aug. 25, 2016

(86) PCT No.: PCT/JP2016/074736
§ 371 (c)(1),
(2) Date: Feb. 23, 2018

(87) PCT Pub. No.: WO2017/038595
PCT Pub. Date: Mar. 9, 2017

(65) Prior Publication Data
US 2019/0157836 A1    May 23, 2019

(30) Foreign Application Priority Data

Aug. 28, 2015 (JP) .................. 2015-169125

(51) Int. Cl.
*H01S 3/13* (2006.01)
*H01S 5/068* (2006.01)
(Continued)

(52) U.S. Cl.
CPC ............ *H01S 5/068* (2013.01); *H01S 5/0425* (2013.01); *H01S 5/0612* (2013.01);
(Continued)

(58) Field of Classification Search
CPC ........ H01S 5/068; H01S 5/0425; H01S 5/105; H01S 5/18; H01S 5/18319; H01S 5/0612; H01S 5/0687
See application file for complete search history.

(56) References Cited

U.S. PATENT DOCUMENTS 9,991,669 B2 * 6/2018 Hirose ................ H01S 5/0085
2004/0247009 A1 * 12/2004 Noda ..................... H01S 5/105
372/99
(Continued)

FOREIGN PATENT DOCUMENTS

CN      1547792 A     11/2004
CN    105191028 A     12/2015
(Continued)

OTHER PUBLICATIONS

Mar. 6, 2018 International Preliminary Report on Patentability issued in International Patent Application No. PCT/JP2016/074736.
(Continued)

*Primary Examiner* — Kinam Park
(74) *Attorney, Agent, or Firm* — Oliff PLC

(57) ABSTRACT

A two-dimensional photonic-crystal surface-emitting laser 10 includes: a two-dimensional photonic crystal (two-dimensional photonic crystal layer 12) including a plate-shaped base body 121 having a predetermined size in which modified refractive index areas 122 whose refractive index
(Continued)

differs from the base body are periodically arranged in a two-dimensional pattern; an active layer 11 provided on one side of the two-dimensional photonic crystal; and first and second electrodes 15 and 16 facing each other across the two-dimensional photonic crystal and the active layer 11, for supplying an electric current to the active layer 11. The modified refractive index areas 122 are provided in such a manner that the in-plane occupancy of those areas 122 in the base body 121 decreases, or the lattice constant for those areas 122 increases, in the direction from an outer edge toward the center of a current passage region 21 which is a region where the electric current passes through the two-dimensional photonic crystal. With this configuration, a stable laser oscillation can be obtained even when a temperature distribution which is lower at the outer edge and higher at the center of the current passage region is formed within the two-dimensional photonic crystal.

8 Claims, 6 Drawing Sheets

(51) Int. Cl.
*H01S 5/10* (2006.01)
*H01S 5/18* (2006.01)
*H01S 5/042* (2006.01)
*H01S 5/183* (2006.01)
*H01S 5/0687* (2006.01)
*H01S 5/06* (2006.01)

(52) U.S. Cl.
CPC ............ *H01S 5/0687* (2013.01); *H01S 5/105* (2013.01); *H01S 5/18* (2013.01); *H01S 5/18319* (2013.01)

(56) References Cited

U.S. PATENT DOCUMENTS

| | | | |
|---|---|---|---|
| 2005/0089075 A1* | 4/2005 | Baba | H01S 5/18391 372/50.1 |
| 2010/0238966 A1* | 9/2010 | Mochizuki | B82Y 20/00 372/99 |
| 2016/0020576 A1* | 1/2016 | Watanabe | G02F 1/3558 359/328 |
| 2016/0248224 A1* | 8/2016 | Noda | H01S 5/0425 |

FOREIGN PATENT DOCUMENTS

| | | |
|---|---|---|
| DE | 112014001188 T5 | 11/2015 |
| JP | 2003-023193 A | 1/2003 |
| JP | 2010-219307 A | 9/2010 |
| JP | 2011-18798 A | 1/2011 |
| JP | 2014-175488 A | 9/2014 |
| WO | 2014/136943 A1 | 9/2014 |

OTHER PUBLICATIONS

Hirose, Kazuyoshi et. al., "Watt-class high-power, high-beam-quality photonic-crystal lasers", Nature Photonics, vol. 8, pp. 406-411, issued on Apr. 13, 2014.

Kyoto University and Hamamatsu Photonics K.K., "Watto-kyuu Koushutsuryoku Fotonikku Kesshou Reezaa: Sekai Ni Sakigakete Jitsugen—Sekai Hatsu, Menhakkou Reezaa Ni Yori Koubiimu Hinshitu De Watto-kyuu No Koushutsuryokuka Wo Tassei (Watt-Class High-Power Photonic-Crystal Lasers: A World-Leading Achievement-High-Quality, Watt-Class High-Power Beam Successfully Generated by Surface-emitting Laser for the First Time in the World-)", [online], Kyoto University Web Page, [accessed on Jul. 23, 2015], the Internet <http://www.kyotou.ac.jp/ja/research/research_results/2014/documents/140414_1/01.pdf>, dated Apr. 10, 2014.

Nov. 15, 2016 Search Report issued in International Patent Application No. PCT/JP2016/074736.

Jun. 13, 2019 Office Action Issued in Chinese Patent Application No. 201680049443.7.

* cited by examiner

Fig. 9A $\Delta T_m = 0$

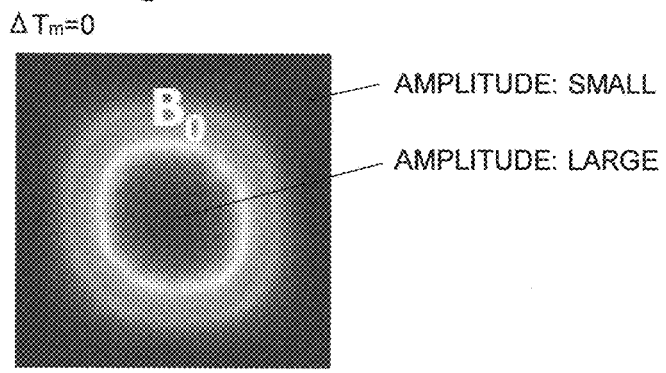

— AMPLITUDE: SMALL
— AMPLITUDE: LARGE

Fig. 9B $\Delta T_m = 1 \ [°C]$

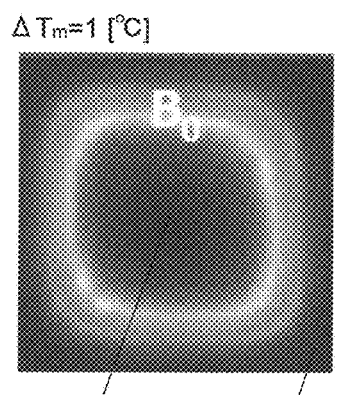

AMPLITUDE: LARGE  AMPLITUDE: SMALL

Fig. 9C $\Delta T_m = 2 \ [°C]$

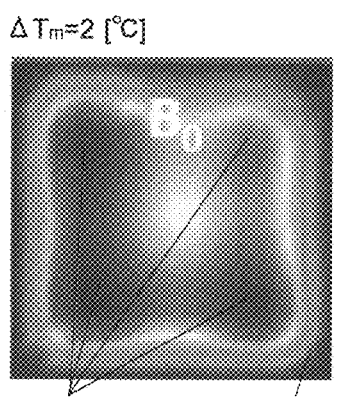

AMPLITUDE: LARGE  AMPLITUDE: SMALL

Fig. 9D $\Delta T_m = 3 \ [°C]$

AMPLITUDE: SMALL

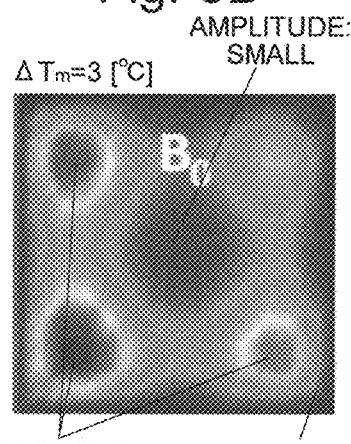

AMPLITUDE: LARGE  AMPLITUDE: SMALL

Fig. 9E $\Delta T_m = 4 \ [°C]$

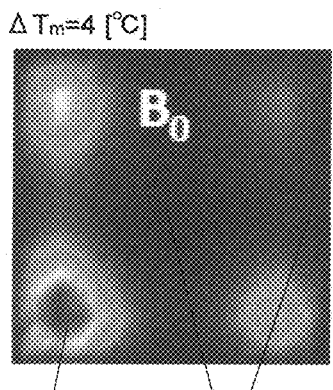

AMPLITUDE: LARGE  AMPLITUDE: SMALL

Fig. 9F $\Delta T_m = 5 \ [°C]$

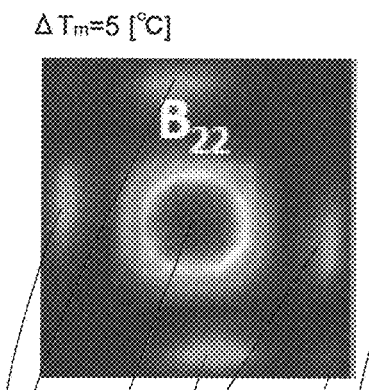

AMPLITUDE: LARGE  AMPLITUDE: SMALL
AMPLITUDE: SLIGHTLY LARGE

Fig. 9G $\Delta T_m = 6 \ [°C]$

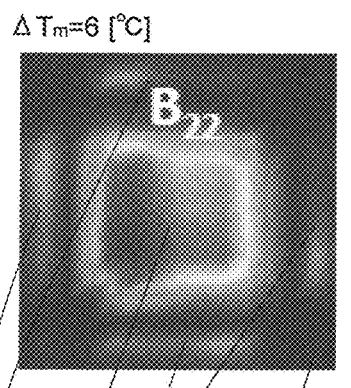

AMPLITUDE: LARGE  AMPLITUDE: SMALL
AMPLITUDE: SLIGHTLY LARGE

TWO-DIMENSIONAL PHOTONIC-CRYSTAL SURFACE-EMITTING LASER

TECHNICAL FIELD

The present invention relates to a semiconductor laser, and particularly, to a two-dimensional photonic-crystal surface-emitting laser in which a two-dimensional photonic crystal is used for amplifying light.

BACKGROUND ART

Semiconductor lasers have many advantages, such as the small size, inexpensiveness, low power consumption and long life. Due to those advantages, semiconductor lasers have 15 been popularly used in a wide range of areas, such as light sources for optical recording, light sources for communications, laser displays, laser printers, or laser pointers. In the area of the laser-beam machining, a laser whose optical output exceeds at least 1 W is needed. However, none of the semiconductor lasers practically used so far have reached this output level. Accordingly, gas lasers, such as a carbon dioxide gas laser, have been used for this purpose.

In recent years, a two-dimensional photonic-crystal surface-emitting laser whose optical output exceeds the level of 1 W has been developed by Noda et al., who are members of the group of the present inventors (Non Patent Literatures 1 and 2). A two-dimensional photonic-crystal surface-emitting laser includes an active layer, a two-dimensional photonic 25 crystal, and a pair of electrodes between which the two previously mentioned elements are sandwiched. The two-dimensional photonic crystal is a device including a plate-shaped base body in which modified refractive index areas whose refractive index differs from that of the base body are periodically arranged, thereby forming a periodic distribution of the refractive index. An injection of electric current from the electrodes into the two-dimensional photonic-crystal surface-emitting laser induces an emission of light in the active layer. In this light, only a specific wavelength of light corresponding to the periodicity of the modified refractive index areas is amplified and causes a laser oscillation, to be eventually emitted as a laser beam in a perpendicular direction to the two-dimensional photonic crystal. This light is emitted from a certain region within the two-dimensional photonic crystal (surface emission). Accordingly, two-dimensional photonic-crystal surface-emitting lasers have a larger emission area than conventional semiconductor lasers and their optical output can be more easily increased. Two-dimensional photonic-crystal surface-emitting lasers themselves have already been known (for example, see Patent Literature 1). A feature of the invention described in Non Patent Literatures 1 and 2 exists in that modified refractive index areas having a right-triangular planar shape are arranged at the lattice points of a square lattice in such a manner that the orthogonally intersecting sides of the right triangle are parallel to the lattice. With this device, the optical output can be increased to approximately 1.5 W.

CITATION LIST

Patent Literature

Patent Literature 1: JP 2003-023193 A

Non Patent Literature

Non Patent Literature 1: Kazuyoshi Hirose and five other authors, "Watt-class high-power, high-beam-quality photonic-crystal lasers", Nature Photonics, Vol. 8, pp. 406-411, issued on Apr. 13, 2014

Non Patent Literature 2: Kyoto University and Hamamatsu Photonics K.K., "Watto-kyuu Koushutsuryoku Fotonikku Kesshou Reezaa: Sekai Ni Sakigakete Jitsugen—Sekai Hatsu, Menhakkou Reezaa Ni Yori Koubiimu Hinshitu De Watto-kyuu No Koushutsuryokuka Wo Tassei (Watt-Class High-Power Photonic-Crystal Lasers: A World-Leading Achievement—High-Quality, Watt-Class High-Power Beam Successfully Generated by Surface-emitting Laser for the First Time in the World—)", [online], Kyoto University Web Page, [accessed on Jul. 23, 2015], the Internet dated Apr. 10, 2014

SUMMARY OF INVENTION

Technical Problem

When an electric current is injected into a two-dimensional photonic-crystal surface-emitting laser, heat is generated inside the device. This heat creates a temperature distribution in each layer of the two-dimensional photonic-crystal surface-emitting laser in such a manner that the temperature increases toward the center of the layer. In order to increase the optical output, a higher amount of current needs to be injected, which makes the unevenness of the temperature distribution more noticeable. Effects of such a temperature distribution have not been considered for conventional types of two-dimensional photonic-crystal surface-emitting lasers. A study by the present inventors focused on this point has revealed that the temperature distribution which occurs in the two-dimensional photonic crystal causes the following problem: In the two-dimensional photonic-crystal surface-emitting laser, the region where the current injected from the electrode passes through in each layer becomes the heat-generating source. The emission of light from the active layer occurs within the range where the current passes through the active layer (i.e. where carriers are injected into the active layer). This light is introduced into and amplified by the two-dimensional photonic crystal. The temperature distribution which occurs in the two-dimensional photonic crystal causes problems within this region where the light is amplified. This region substantially coincides with the current passage region in the two-dimensional photonic crystal. In the following description, the temperature distribution within the current passage region in the two-dimensional photonic crystal is primarily considered. It should be noted that the term "current passage region" as used in the following description means the current passage region in the two-dimensional photonic crystal unless a different layer in the two-dimensional photonic crystal laser is specifically mentioned.

FIGS. 9A-9G show the results of a calculation of the oscillation mode of light for a conventional two-dimensional photonic-crystal surface-emitting laser, taking into account the unevenness of the temperature distribution. The calculation conditions were as follows: Modified refractive index areas having a right-angular planar shape were arranged at the lattice points of a square lattice on a base body in such a manner that the orthogonally intersecting sides of the right triangle were parallel to the lattice. The orthogonally intersecting sides each had a length of 166 nm. The lattice constant of the square lattice was 294 nm. A square region having a one-side length of 200 μm was considered as the current passage region. The calculation was performed for each of the following cases: In one case, the temperature difference $\Delta T_m$ between the temperature $T_c$ at the center of the current passage region and the temperature $T_b$ at the outer edge was assumed to be zero ($\Delta T_m$=0; FIG. 9A), and in the other cases, the value of $\Delta T_m$ was set within a range of 1-6° C. in steps of 1° C. (FIGS. 9B-9G). When the temperature difference $\Delta T_m$ was zero (FIG. 9A) or had a small value of 1° C. (FIG. 9B), a fundamental mode of standing wave, with the amplitude being larger at the center and smaller at the outer edge, was formed within the two-dimensional photonic crystal. By comparison, when the temperature difference $\Delta T_m$ was within a range of 2-4° C. (FIGS. 9C-9E), a higher-order mode of standing wave, with the amplitude being smaller at the center as well as at the outer edge while being larger within the areas between the center and the outer edge, was formed within the current passage region (i.e. the region where the optical amplification occurs). When the temperature difference $\Delta T_m$ was further increased to 5 or 6° C. (FIG. 9F or 9G), the oscillation mode of the standing wave within the current passage region became different from those shown in FIGS. 9A-9E, with the amplitude being larger at the center and smaller at the outer edge while being slightly larger within the area between the center and the outer edge. Thus, even a slight change in the temperature distribution within the current passage region causes a change in the oscillation mode of the light within the current passage region and makes it impossible to obtain a stable laser oscillation.

The problem to be solved by the present invention is to provide a two-dimensional photonic-crystal surface-emitting laser capable of generating a stable laser oscillation even when a temperature distribution which is higher at its center and lower at its outer edge is formed within the current passage region of the two-dimensional photonic crystal.

Solution to Problem

A two-dimensional photonic-crystal surface-emitting laser according to the first aspect of the present invention developed for solving the previously described problem includes: a two-dimensional photonic crystal including a plate-shaped base body having a predetermined size in which modified refractive index areas whose refractive index differs from the base body are periodically arranged in a two-dimensional pattern; an active layer provided on one side of the two-dimensional photonic crystal; and a pair of electrodes facing each other across the two-dimensional photonic crystal and the active layer, for supplying an electric current to the active layer, wherein:

the modified refractive index areas are provided in such a manner that the in-plane occupancy of the modified refractive index areas in the base body increases in a direction from an outer edge toward the center of a current passage region which is a region where the electric current passes through the two-dimensional photonic crystal.

The in-plane occupancy is defined as the ratio of the area of the modified refractive index areas to the area of the base body per one unit of periodicity of the modified refractive index areas. If each modified refractive index area has an area which changes depending on the position in the thickness direction of the base body, the area of the modified refractive index area is defined as the average area in the thickness direction.

A two-dimensional photonic-crystal surface-emitting laser according to the second aspect of the present invention includes: a two-dimensional photonic crystal including a plate-shaped base body having a predetermined size in which modified refractive index areas whose refractive index differs from the base body are periodically arranged in a two-dimensional lattice pattern; an active layer provided on one side of the two-dimensional photonic crystal; and a pair of electrodes facing each other across the two-dimensional photonic crystal and the active layer, for supplying an electric current to the active layer, wherein:

the modified refractive index areas are arranged in such a manner that a lattice constant decreases in a direction from an outer edge toward the center of a current passage region which is a region where the electric current passes through the two-dimensional photonic crystal.

In the two-dimensional photonic-crystal surface-emitting laser according to the present invention, the modified refractive index areas are provided in such a manner that the in-plane occupancy of those areas increases (first aspect of the present invention) or the lattice constant for those areas decreases (second aspect of the present invention) with the in-plane position on the two-dimensional photonic crystal in the direction from an outer edge toward the center of the current passage region. This configuration cancels the influence of the unevenness of the temperature distribution whose level increases in the direction from the outer edge toward the center, thereby allowing one specific oscillation mode of standing wave to be easily formed within the two-dimensional photonic crystal. Consequently, a stable laser oscillation is obtained.

It is not essential to arrange modified refractive index areas outside the current passage region. However, in order to prevent the reflection of light at the outer edge of the current passage region, a periodical arrangement of the modified refractive index areas having the same structure as the outer edge of the current passage region may preferably be formed outside the current passage region.

In a preferable mode of the two-dimensional photonic-crystal surface-emitting laser according to the first aspect of the present invention, the difference $\Delta f(x, y)$ between the in-plane occupancy $f(x, y)$ at any in-plane position within the current passage region and the in-plane occupancy $f_b$ at the outer edge, i.e. $\Delta f(x, y) = f(x, y) - f_b$, is proportional to the difference $\Delta T(x, y)$ between the temperature $T(x, y)$ at the in-plane position concerned and the temperature $T_b$ at the outer edge, i.e. $\Delta T(x, y) = T(x, y) - T_b$ (>0), with a positive proportionality coefficient. $\Delta T(x, y)$ can be determined by an experiment or computation based on the amount of electric current determined by the required level of optical output. The proportionality coefficient can also be determined by an experiment or computation. For example, a computation by the present inventors has shown that $\Delta f(x, y)$ can be given by:

$$\Delta f(x, y) = -\frac{\frac{\partial n_{e\!f\!f}^{(0)}}{\partial T}}{\frac{\partial n_{e\!f\!f}^{(0)}}{\partial f} + \frac{n_{e\!f\!f}^{(0)}}{\omega_0}\frac{\partial \omega}{\partial f}} \Delta T(x, y) \quad (1)$$

where $n_{e\!f\!f}$ is the effective refractive index, which is defined as the sum of the refractive indices of the base body and the modified refractive index areas multiplied by their respective in-plane occupancies. $\partial n_{e\!f\!f}^{(0)}/\partial T$ is the rate of change in the effective refractive index with respect to the temperature. $\partial n_{e\!f\!f}^{(0)}/\partial f$ is the rate of change in the effective refractive index with respect to a change in the in-plane occupancy f of the modified refractive index areas. $\omega_0$ is the resonance frequency of light calculated from the in-plane occupancy, lattice constant and other parameters. $\partial \omega/\partial f$ is the rate of change in the resonance frequency with respect to a change in the in-plane occupancy. According to a simulation calculation, the numerator has a positive value, while the denominator has a negative value. Therefore, the proportionality coefficient, inclusive of the minus sign in equation (1), has a positive value. Since ΔT by definition has a positive value, the entire right side of equation (1) has a positive value. Accordingly, Δf(x, y) has a positive value, which means that the in-plane occupancy increases in the direction from the outer edge toward the center of the current passage region.

Similarly, in a preferable mode of the two-dimensional photonic-crystal surface-emitting laser according to the second aspect of the present invention, the difference Δa(x, y) between the lattice constant a(x, y) at any in-plane position within the current passage region and the lattice constant $a_b$ at the outer edge, i.e. Δa(x, y)=a(x, y)–$a_b$, is proportional to the difference ΔT(x, y) between the temperature T(x, y) at the in-plane position concerned and the temperature $T_b$ at the outer edge, ΔT(x, y)=T(x, y)–$T_b$ (>0), with a negative proportionality coefficient. A computation by the present inventors has shown that Δa can be given by:

$$\Delta a(x, y) = -a_b \frac{\partial n_{eff}^{(0)} / \partial T}{n_{eff}^{(0)}} \Delta T(x, y) \quad (2)$$

where $n_{eff}^{(0)}$ is the effective refractive index before the injection of the electric current (i.e. when temperature distribution is flat). Although the lattice constant at the outer edge, i.e. $a_b$, is included not only on the left side (Δa(x, y)=a(x, y)–$a_b$) but also on the right side of the equation, there is no problem in determining Δa(x, y) at any in-plane position, since $a_b$ is a constant. Furthermore, in normal cases, since Δa(x, y) is sufficiently smaller than $a_b$, the position-dependent change in the lattice constant by an amount of Δa(x, y) merely produces a negligible influence on the wavelength (or frequency) of the standing wave. According to a simulation calculation, the numerator has a positive value. Therefore, the proportionality coefficient, inclusive of the minus sign in equation (2), has a negative value. Since ΔT(x, y) has a positive value as noted earlier, the entire right side of equation (2) has a negative value. Accordingly, Δa(x, y)=a(x, y)–$a_b$ has a negative value, which means that the lattice constant decreases in the direction from the outer edge toward the center of the current passage region.

In most cases, the temperature distribution in a two-dimensional photonic crystal has a form in which the temperature is highest at the center and concentrically decreases from that point. In such a case, the modified refractive index areas may preferably be provided in such a manner that the in-plane occupancy concentrically decreases from the center of the in-plane position in the case of the first aspect of the present invention, or the lattice constant concentrically increases from the center of the in-plane position in the case of the second aspect of the present invention. However, it is not always the case that the temperature distribution in the two-dimensional photonic crystal is formed in the aforementioned way. The in-plane occupancy or lattice constant of the modified refractive index areas should be adapted to the actual temperature distribution.

In the forgoing descriptions, the first and second aspects of the present invention have been handled as separate devices. A single two-dimensional photonic-crystal surface-emitting laser the features of both first and second aspects of the present invention is also possible. That is to say, the modified refractive index areas in the two-dimensional photonic-crystal surface-emitting laser according to the present invention may be provided in such a manner that the in-plane occupancy of those areas increases in the direction from the outer edge toward the center of the current passage region while the lattice constant for those areas decreases in the same direction.

Advantageous Effects of the Invention

The two-dimensional photonic-crystal surface-emitting laser according to the present invention can generate a stable laser oscillation even when a temperature distribution which is lower at the outer edge and higher at the center of the current passage region is formed within the two-dimensional photonic crystal.

BRIEF DESCRIPTION OF DRAWINGS

FIGS. 9A-9G show the result of a simulation of the oscillation mode of light for a conventional two-dimensional photonic-crystal surface-emitting laser in the case where an unevenness in the temperature distribution occurs in the plane of the two-dimensional photonic crystal.

DESCRIPTION OF EMBODIMENTS

An embodiment of the two-dimensional photonic-crystal surface-emitting laser according to the present invention is hereinafter described using FIGS. 1-8.

Figure 1:
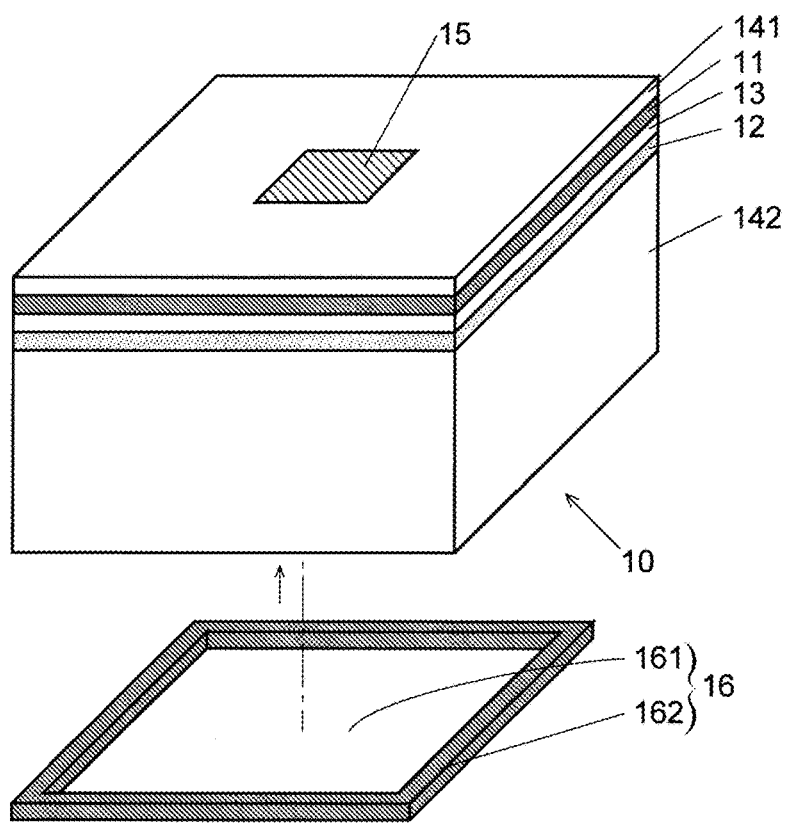
FIG. 1 is a perspective view showing one embodiment of the two-dimensional photonic-crystal surface-emitting laser according to the present invention.

As shown in FIG. 1, the two-dimensional photonic-crystal surface-emitting laser 10 in the present embodiment includes a first electrode 15, first cladding layer 141, active layer 11, spacer layer 13, two-dimensional photonic-crystal layer 12 (which corresponds to the two-dimensional photonic crystal mentioned earlier), second cladding layer 142, and second electrode 16 sequentially stacked in the mentioned order. The active layer 11 and the two-dimensional photonic-crystal layer 12 may be transposed. For convenience, the two-dimensional photonic-crystal surface-emitting laser 10 shown in FIG. 1 have the first and second electrodes 15 and 16 located on its upper and lower sides, respectively. However, the direction of the laser in use is not limited to the shown example. The configuration of each layer is hereinafter described.

The active layer 11 emits light within a specific wavelength band upon receiving electric charges injected from the first and second electrodes 15 and 16. The material used for the active layer 11 in the present embodiment is a multiple quantum well of InGaAs/AlGaAs (emission wavelength band: 935-945 nm). However, the material for the active layer in the present invention is not limited to this example. The active layer 11 has a square shape with a thickness of approximately 2 μm. The one-side length of this square is equal to or slightly larger than that of the outer contour of the frame portion 162 of the second electrode 16 (which will be described later). The active layer 11 in the present invention is not limited to these dimensions. Its shape may also be changed, such as a circular or hexagonal shape.

Figure 3:
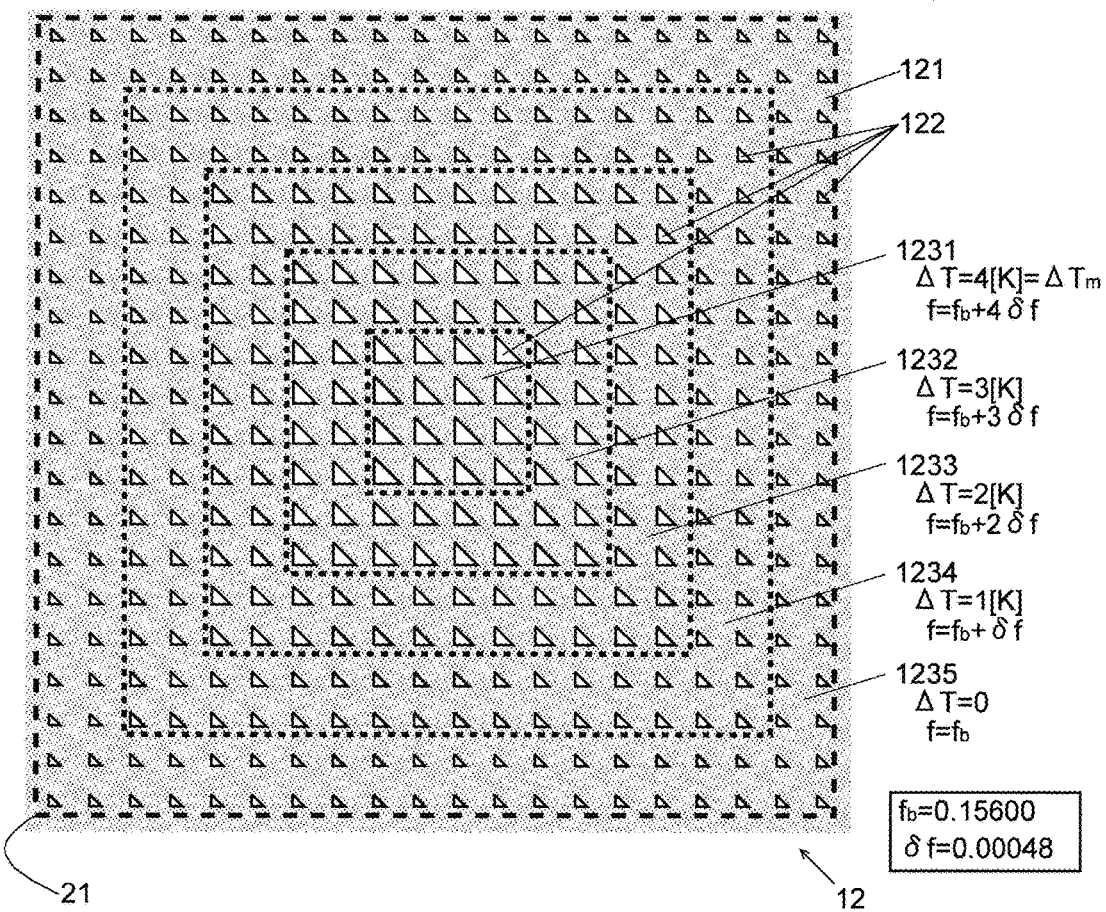
FIG. 3 is a plan view showing one example of the two-dimensional photonic-crystal layer in the two-dimensional photonic-crystal surface-emitting laser according to the embodiment, in which the in-plane occupancy of the modified refractive index areas increases in the direction from the outer edge toward the center.

As shown in FIG. 3, the two-dimensional photonic-crystal layer 12 includes a plate-shaped main body 121 in which modified refractive index areas 122 whose refractive index differs from that of the main body are periodically arranged. The material used for the main body 121 in the present embodiment is GaAs. However, the material for the main body in the present invention is not limited to this example. The modified refractive index areas 122 in the present embodiment are holes (air or vacuum). Detailed descriptions of the shape and arrangement of the modified refractive index areas 122 will be given later.

The spacer layer 13 is provided to connect the active layer 11 and the two-dimensional photonic-crystal layer 12, which are made of different materials. The material used for the spacer layer 13 in the present embodiment is AlGaAs, which should be appropriately changed depending on the materials used for the active layer 11 and the two-dimensional photonic-crystal layer 12.

The first and second cladding layers 141 and 142 have the functions of connecting the first electrode 15 with the active layer 11 and the second electrode 16 with the two-dimensional photonic crystal layer 12, respectively, as well as facilitating the injection of the electric current from the first and second electrodes 15 and 16 into the active layer 11. In order to enable the cladding layers to perform those functions, a p-type semiconductor is used as the material for the first cladding layer 141, while an n-type semiconductor is used as the material for the second cladding layer 142. The first cladding layer 141 has a two-layer structure consisting of a p-GaAs layer and p-AlGaAs layer arranged from the first electrode 15. Similarly, the second cladding layer 142 has a two-layer structure consisting of a n-GaAs layer and n-AlGaAs layer arranged from the second electrode 16 (those two-layer structures are not shown in the figure). The materials for the first and second cladding layers 141 and 142 in the present invention are not limited to the mentioned examples. The planar dimensions of the first and second cladding layers 141 and 142 are the same as those of the active layer 11 and the base body 121 of the two-dimensional photonic-crystal layer 12. The thickness of the first cladding layer 141 is 2 μm, while that of the second cladding layer is 200 μm.

Figure 2:
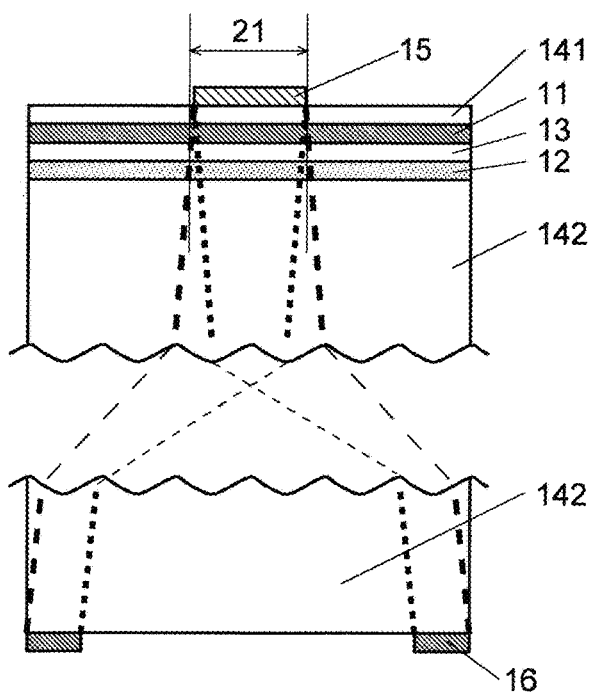
FIG. 2 is a diagram schematically showing the current passage region of the two-dimensional photonic-crystal layer in the two-dimensional photonic-crystal surface-emitting laser according to the embodiment.

As just described, the first cladding layer 141 is much thinner than the second cladding layer 142. Accordingly, the distance between the two-dimensional photonic-crystal layer 12 and the first electrode 15 is much smaller than the distance between the two-dimensional photonic-crystal layer 12 and the second electrode 16. Consequently, as shown in FIG. 2, the current passage region 21, where the electric current flowing between the first and second electrodes 15 and 16 passes through the two-dimensional photonic-crystal layer 12, becomes almost the same as the region where the first electrode 15 is provided. Furthermore, since the distance between the active layer 11 and the two-dimensional photonic-crystal layer 12 in the present embodiment is much smaller than the distance between the two-dimensional photonic-crystal layer 12 and the second electrode 16, the region within which carriers are injected into the active layer 11 becomes almost the same as the current passage region 21 in the two-dimensional photonic-crystal layer 12.

The first electrode 15 has a square planar shape whose one-side length is 200 μm and is shorter than those of the other layers. Therefore, the current passage region 21 can also be approximated by a square whose one-side length is 200 μm. The second electrode 16 is a square plate member having a square hollow portion formed inside. This hollow portion of the plate member is hereinafter called the "window portion 161", while the remaining portion of the plate member is called the "frame portion 162". The one-side length of the square plate member (outer side of the frame portion 162) is 800 μm, and that of the square window portion 161 is 600 μm. The laser light amplified within the two-dimensional photonic-crystal layer 12 oscillates in this layer, to be emitted through the window portion 161 to the outside of the two-dimensional photonic-crystal surface-emitting laser 10. The material used for the first electrode 15 and the frame portion 162 of the second electrode 16 may be a good conductor (e.g. gold) or a semiconductor having the same polarity as the neighboring cladding layer (a p-type semiconductor for the first electrode 15, and an n-type semiconductor for the second electrode 16).

The shape and arrangement of the modified refractive index areas 122 in the two-dimensional photonic-crystal layer 12 will be hereinafter described. As shown in FIG. 3, the modified refractive index areas 122 within the current passage region 21 are divided by virtual square lines (thick broken lines in FIG. 3) into five zones 1231-1235 from the central zone 1231 to the end zone 1235 concentrically arranged from the center of the in-plane position. Within each zone, the modified refractive index areas 122 are arranged in a square lattice pattern. The spatial interval of the modified refractive index areas 122 (lattice constant) is the same in all zones. In any of these zones, the modified refractive index areas 122 have a right-angular planar shape and are arranged in such a manner that the two orthogonally intersecting sides of the right triangle are aligned with the orthogonally intersecting grid lines of the square lattice.

The in-plane occupancy f(x, y) of the modified refractive index areas 122 is f(x, y)=$f_b$=0.15600 (15.600%) in the end zone 1235 and is gradually increased in the direction from the end zone 1235 toward the central zone 1231. Any two zones neighboring each other has a difference in the in-plane occupancy f(x, y) by an amount of 6f(x, y)=Δf(x, y)/ΔT(x, y)=0.00048 (0.048%). (In FIG. 3, for ease of understanding, the difference in the in-plane occupancy between the mutually neighboring zones is overdrawn, and the number of modified refractive index areas 122 shown in the figure is fewer than their actual number.) This value of 6f(x, y) has been calculated from equation (1) on the assumption that a temperature difference of 4° C. occurs between the central zone 1231 and the end zone 1235, with a temperature difference of 1° C. between any two zones neighboring each other, when the two-dimensional photonic-crystal surface-emitting laser 10 is in use. The value used as the numerator of the fraction in equation (1) was 2.67×10 [$K^{-1}$], which is an approximated value for GaAs used as the material for the base body 121. The value used as the denominator was −0.56, which was determined by a simulation based on the coupled-wave theory for the case where the laser oscillation occurs in the so-called "band edge A" oscillation mode.

Figure 4:
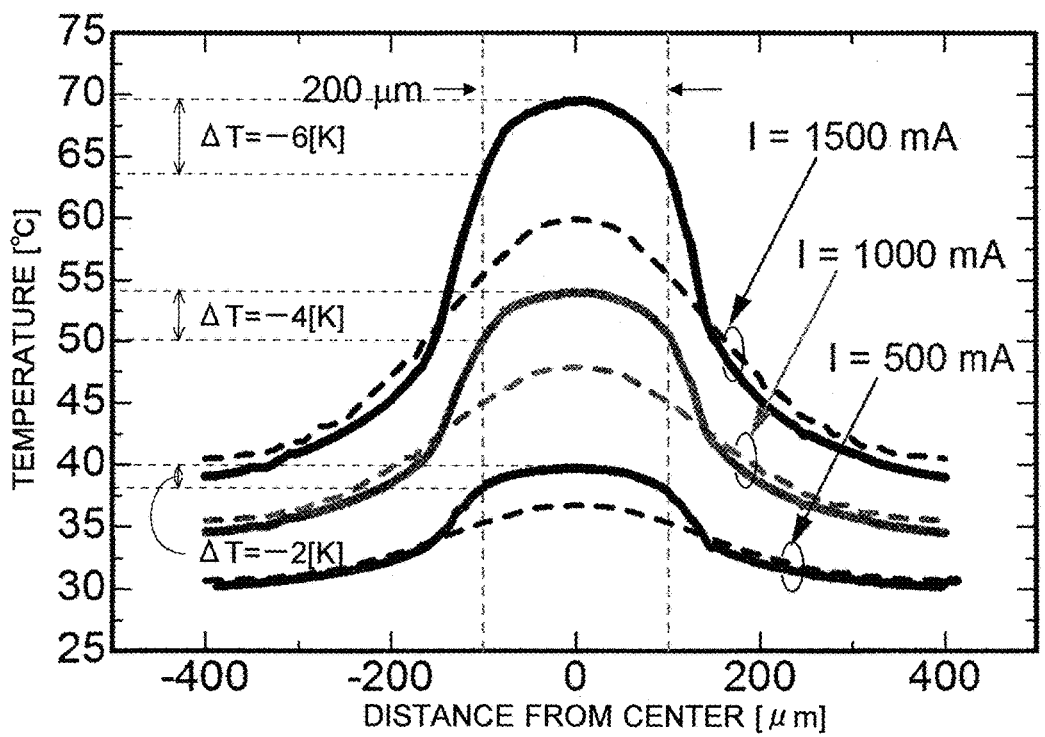
FIG. 4 is a graph showing the result of a simulation of the temperature distribution in a two-dimensional photonic-crystal layer (the data indicated by the solid lines) as well as the temperature distribution on the surface of a two-dimensional photonic-crystal surface-emitting laser (the data indicated by the broken lines).

The temperature difference of 4° C. between the central zone 1231 and the end zone 1235 has been chosen based on a simulation of the temperature distribution: As shown in FIG. 4, when an electric current of 1000 mA is passed between the first and second electrodes 15 and 16, the temperature difference $\Delta T_m$ between the center (x=0 on the x axis) and outer edges (x=100 μm) of the current passage region 21 becomes 4° C. As can be seen in FIG. 4, an increase in the current value leads to a greater value of $\Delta T_m$. Based on this relationship, the temperature difference $\Delta T_m$ between the central zone 1231 and the end zone 1235 can be appropriately set according to the current value. In FIG. 4, the data indicated by the solid lines show the temperature distribution in the two-dimensional photonic-crystal layer 12, while those indicated by the broken lines show the temperature distribution on the surface of the two-dimensional photonic-crystal surface-emitting laser 10.

Figure 5:
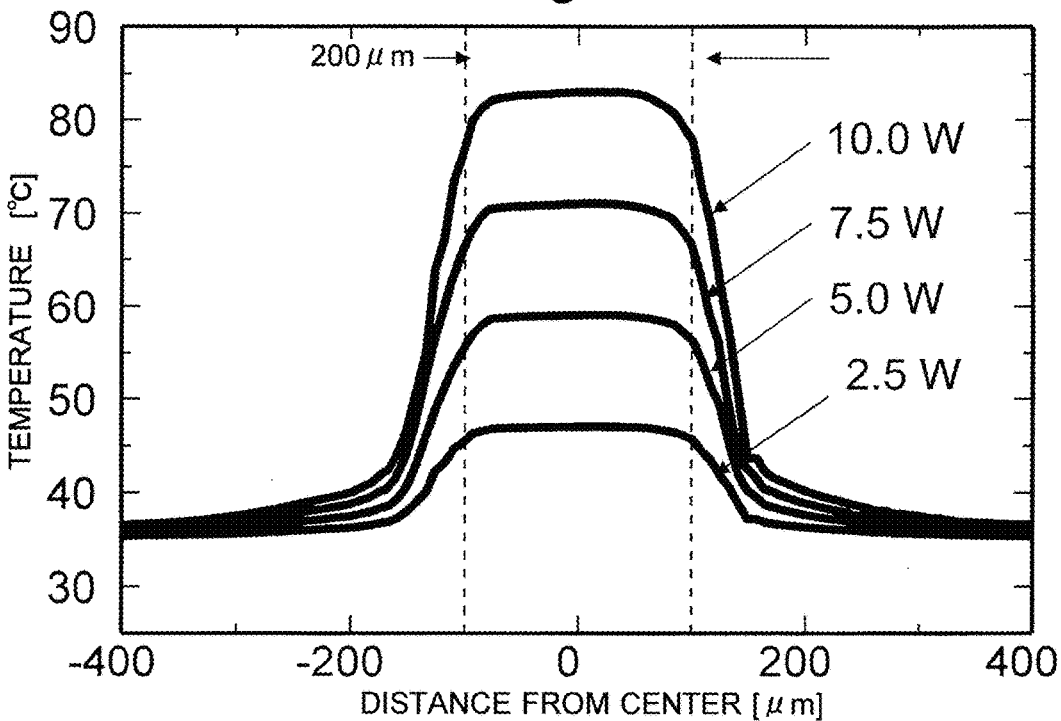
FIG. 5 is a graph showing the result of a simulation of the temperature distribution on the surface of a two-dimensional photonic-crystal layer in the case where a substrate having a higher thermal conductivity than the one in the case of FIG. 4 was used.

The value of the temperature difference $\Delta T_m$ can be decreased by improving the heat dissipation capability of the two-dimensional photonic-crystal surface-emitting laser 10. FIG. 5 shows the result of a simulation of the temperature distribution on the surface of the two-dimensional photonic-crystal layer 12 in the case where a substrate that is made to be in contact with the first cladding layer 141 for the installation of the two-dimensional photonic-crystal surface-emitting laser 10 is made of a material having a higher thermal conductivity than the one used in the case of FIG. 4. The temperature distribution within the current passage region (approximately 200 μm) is flatter than in FIG. 4. The temperature difference $\Delta T_m$ is also smaller than in FIG. 4; its largest value is approximately 3° C.

Though not shown, the modified refractive index areas 122 outside the current passage region 21 are arranged with the same in-plane occupancy and lattice constant as those used in the end zone 1235 inside the current passage region 21.

Figure 6:
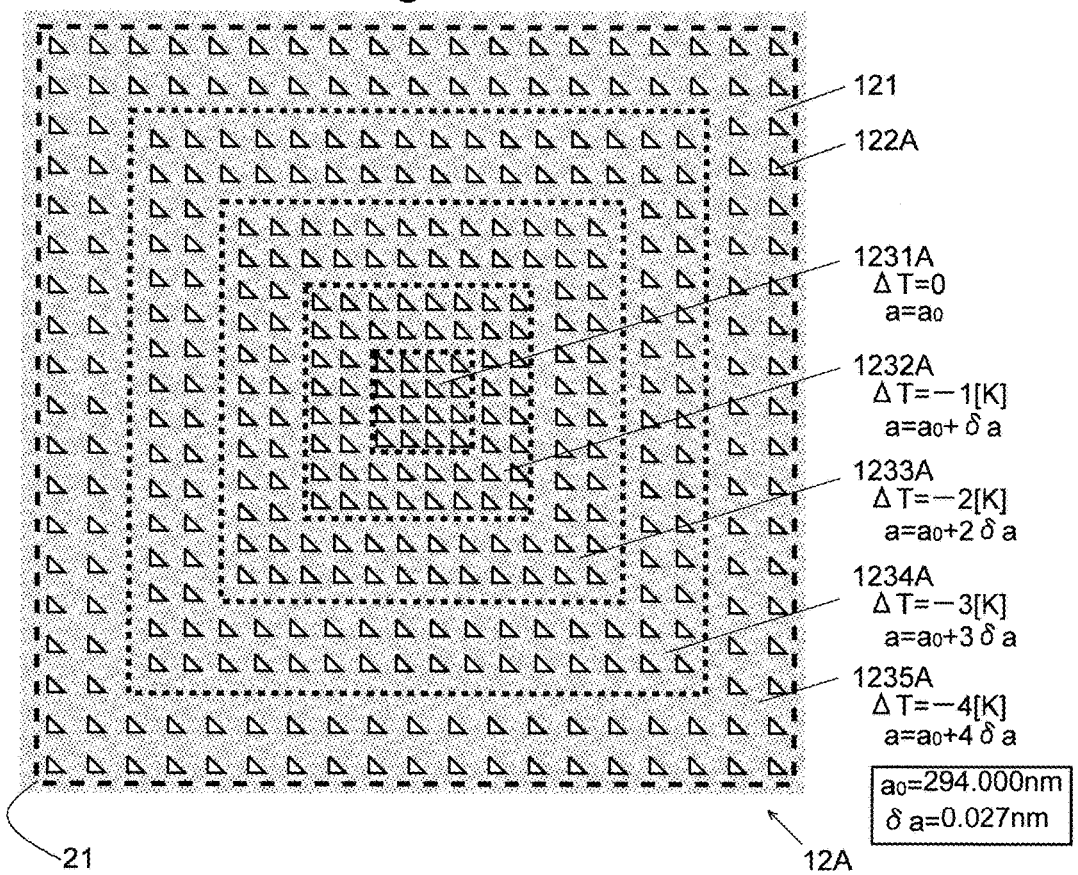
FIG. 6 is a plan view showing another example of the two-dimensional photonic-crystal layer in the two-dimensional photonic-crystal surface-emitting laser according to the embodiment, in which the lattice constant for the modified refractive index areas increases in the direction from the center toward the outer edge.

FIG. 6 shows a two-dimensional photonic-crystal layer 12A as another example. The two-dimensional photonic-crystal layer 12A is identical to the previously described two-dimensional photonic-crystal layer 12 in that the base body 121 is divided by virtual square lines (thick broken lines in FIG. 6) into five zones 1231A-1235A from the end zone 1235A to the central zone 1231A concentrically arranged from the center of the in-plane position, and the modified refractive index areas 122A are arranged in a square lattice pattern within each zone. The two-dimensional photonic-crystal layer 12A differs from the previous example in that the modified refractive index areas 122A have the same planar area in all zones, while their lattice constant a(x, y) is gradually decreased in the direction from the end zone 1235A toward the central zone 1231A. The value of the lattice constant a(x, y) is a(x, y)=$a_b$=294.000 nm in the end zone 1235A and is changed by an amount of δa=Δa/ΔT=0.027 nm for each zone on the assumption that a temperature difference of 1° C. occurs between any two zones neighboring each other. (In FIG. 6, for ease of understanding, the difference in the lattice constant between the mutually neighboring zones is overdrawn, and the number of modified refractive index areas 122A shown in the figure is fewer than their actual number.) The aforementioned value, 0.027 nm, has been calculated from equation (2) on the assumption that a temperature difference of 4° C. occurs between the central zone 1231A and the end zone 1235A, with a temperature difference of 1° C. between any two zones neighboring each other, when the two-dimensional photonic-crystal surface-emitting laser 10 is in use. The value used as the numerator of the fraction in equation (2) is 2.67×$10^4$ [$K^{-1}$], i.e. the same value as used in the previous example. The value used as the denominator $n_{eff}^{(0)}$ is 2.92, which has been calculated from the refractive index of GaAs (3.28) taking into account the in-plane occupancy of the modified refractive index areas 122A in the central zone 1231A.

A calculation for confirming the stability of the laser oscillation was performed for the two-dimensional photonic-crystal surface-emitting laser 10 in the present embodiment. Specifically, the possible modes of oscillation of the light within the two-dimensional photonic crystal were calculated, and a threshold gain difference Δα (unit: $cm^{-1}$) was determined, which is the difference between the lasing threshold for the fundamental mode in which the laser oscillation is achieved at the lowest energy level and the lasing threshold for the "next-order" mode in which the laser oscillation is achieved at the second lowest energy level. A greater value of the threshold gain difference Δα means that the next-order mode of oscillation is less likely to occur, and a stable laser oscillation will be obtained. The threshold gain difference Δα was calculated with respect to the temperature difference $\Delta T_m$ between the center and the outer edge of the current passage region 21 (which is hereinafter simply called the "temperature difference $\Delta T_m$"), with $\Delta T_m$ varied from 0° C. to 6° C. in steps of 1° C. As mentioned earlier, $\Delta T_m$=4° C. corresponds to the temperature difference assumed in the designing of the two-dimensional photonic-crystal surface-emitting laser 10. When the temperature difference $\Delta T_m$ is within a range of 5-6° C., it means that the temperature difference is larger than expected. For comparison, a similar calculation was also performed for a device which had the same in-plane occupancy f and lattice constant a over the entire area of the two-dimensional photonic-crystal layer.

Figure 7:
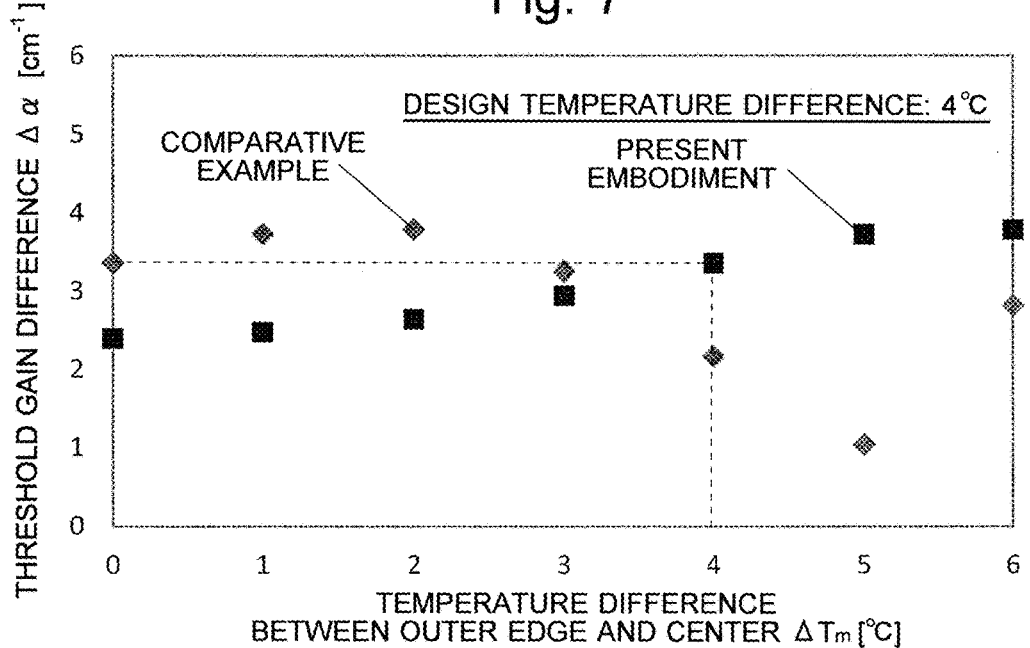
FIG. 7 is a graph showing the result of a calculation of the value of a threshold gain difference with respect to the temperature difference between the center and the outer edge of the two-dimensional photonic crystal in the two-dimensional photonic-crystal surface-emitting laser in the embodiment as well as a comparative example.

The graph in FIG. 7 shows the calculated result of the threshold gain difference Δα. The calculation yields the same result in both the case where the two-dimensional photonic-crystal layer 12 (with the adjusted in-plane occupancy f(x, y)) is used and the case where the two-dimensional photonic-crystal layer 12A (with the adjusted lattice constant a(x, y)) is used. When the temperature difference $\Delta T_m$ is 4° C., the value of threshold gain difference Δα in the present embodiment is larger than in the comparative example for the same temperature difference, and is equal to the value for a temperature difference of $\Delta T_m=0$ in the comparative example. This is because the two-dimensional photonic-crystal surface-emitting laser 10 is designed to be in an optimum state when the temperature difference $\Delta T_m$ is 4° C. When the temperature difference $\Delta T_m$ increases 6° C., the oscillation mode in the comparative example changes from the one at a temperature difference $\Delta T_m$ of 5° C. or less (and the value of the threshold gain difference $\Delta\alpha$ increases along with that change). In the present embodiment, the oscillation mode is the same as when the temperature difference $\Delta T_m$ is 5° C. or less, and yet a higher threshold gain difference $\Delta\alpha$ is achieved than when the temperature difference $\Delta T_m$ is 4° C.

A brief description on the derivation of equations (1) and (2) is as follows.

Consider a two-dimensional photonic-crystal layer which has neither the spatial distribution of the in-plane occupancy f nor the spatial distribution of the lattice constant a. If a spatial distribution of the temperature occurs in this two-dimensional photonic-crystal layer, a corresponding spatial distribution of the effective refractive index $n_{eff}$ occurs in the same layer. In this situation, the wave-number offset $\delta^{(T)}$, which indicates the displacement of the wave number of the standing wave formed within the two-dimensional photonic-crystal layer from a value computed from the lattice constant, is given by:

$$\delta^{(T)} = \delta^{(0)'} + \Delta n_{eff}^{(T)} \omega^{(T)}/c \qquad (3)$$

where $\delta^{(0)'}$ is a constant, $\Delta n_{eff}^{(T)}$ is a change in the effective refractive index $n_{eff}$ with respect to a temperature change, $\omega^m$ is the frequency under the influence of the spatial distribution of the temperature, and c is the speed of light. The second term on the right side of equation (3) indicates the influence of the spatial distribution of the temperature. This term, which is hereinafter denoted by $\Delta\delta^{(T)}$, can be rewritten as follows:

$$\Delta\delta^{(T)}(x,y) = \Delta n_{eff}^{(T)} \omega^{(T)}/c$$

$$= \Delta n_{eff}^{(T)} \omega_0 (\omega^{(T)}/\omega_0)/c$$

$$\sim \Delta n_{eff}^{(T)} \omega_0/c \text{ (with the approximation of } \omega^{(T)}/\omega_0 \sim 1)$$

$$\sim (\partial n_{eff}^{(0)}/\partial T) \cdot \Delta T(x,y) \cdot \omega_0/c \qquad (4)$$

where $\omega_0$ is the frequency with no influence of the spatial distribution of the temperature.

In the case of a two-dimensional photonic-crystal layer which has a spatial distribution in the in-plane occupancy f(x, y), the wave-number offset $\delta^{(f)}$ is given by:

$$\delta^{(f)}(x,y) \sim (n_{eff}^{(0)} \omega^{(f)}/c + \Delta f \cdot \partial (n_{eff}^{(0)} \omega^{(f)}/c)/\partial f) - (\Omega_0/c) \sim \delta^{(0)}$$
$$+ (\omega_0/c) \cdot (\partial n_{eff}^{(0)}/\partial f + (n_{eff}^{(0)}/\omega_0) \cdot (\partial \omega/\partial f) \cdot \Delta f(x,y) \qquad (5)$$

The second term on the right side of equation (5) indicates the influence of the spatial distribution of the in-plane occupancy f(x, y). This term is hereinafter denoted by $\Delta\delta^{(f)}(x, y)$, i.e.:

$$\Delta\delta^{(f)}(x,y) = (\omega_0/c) \cdot (\partial n_{eff}^{(0)}/\partial f + (n_{eff}^{(0)}/\omega_0) \cdot (\partial \omega/\partial f) \cdot \Delta f(x,y) \qquad (6)$$

From equations (4) and (6), the influence of the spatial distribution of the temperature can be cancelled by the spatial distribution of the in-plane occupancy f when the following equation holds true:

$$\Delta\delta^{(T)}(x,y) + \Delta\delta^{(f)}(x,y) = 0 \qquad (7)$$

i.e., $$(\partial n_{eff}^{(0)}/\partial T) \Delta T(x,y) \cdot \omega_0/c + (\omega_0/c) \cdot (\partial n_{eff}^{(0)}/\partial f) + (n_{eff}^{(0)}/\omega_0) \cdot (\partial \omega/\partial f) \cdot \Delta f(x,y) = 0 \qquad (8)$$

By transforming this equation (8), equation (1) can be obtained.

In the case of a two-dimensional photonic-crystal layer which has a spatial distribution in the lattice constant a(x, y), the wave-number offset $\delta^{(a)}$ is given by:

$$\delta^{(a)}(x,y) = \delta^{(0)'} + (\omega_0/c) \cdot (1 - (a^{(0)}/a(x,y))) \qquad (9)$$

The second term on the right side of equation (9) indicates the influence of the spatial distribution of the lattice constant a. This term is hereinafter denoted by $\Delta\delta^{(a)}$, i.e.:

$$\Delta\delta^{(a)}(x,y) = -(\omega_0/c) \cdot ((a^{(0)}/a(x,y)) - 1) \qquad (10)$$

From equations (4) and (10), the influence of the spatial distribution of the temperature can be cancelled by the spatial distribution of the lattice constant a when the following equation holds true:

$$\Delta\delta^{(T)}(x,y) + \Delta\delta^{(a)}(x,y) = 0 \qquad (11)$$

i.e., $$(\partial n_{eff}^{(0)}/\partial T) \cdot \Delta T(x,y) \cdot \omega_0/c - (\omega_0/c) \cdot ((a^{(0)}/a(x,y)) - 1) = 0 \qquad (12)$$

By transforming this equation (12), equation (2) can be obtained.

Figure 8:
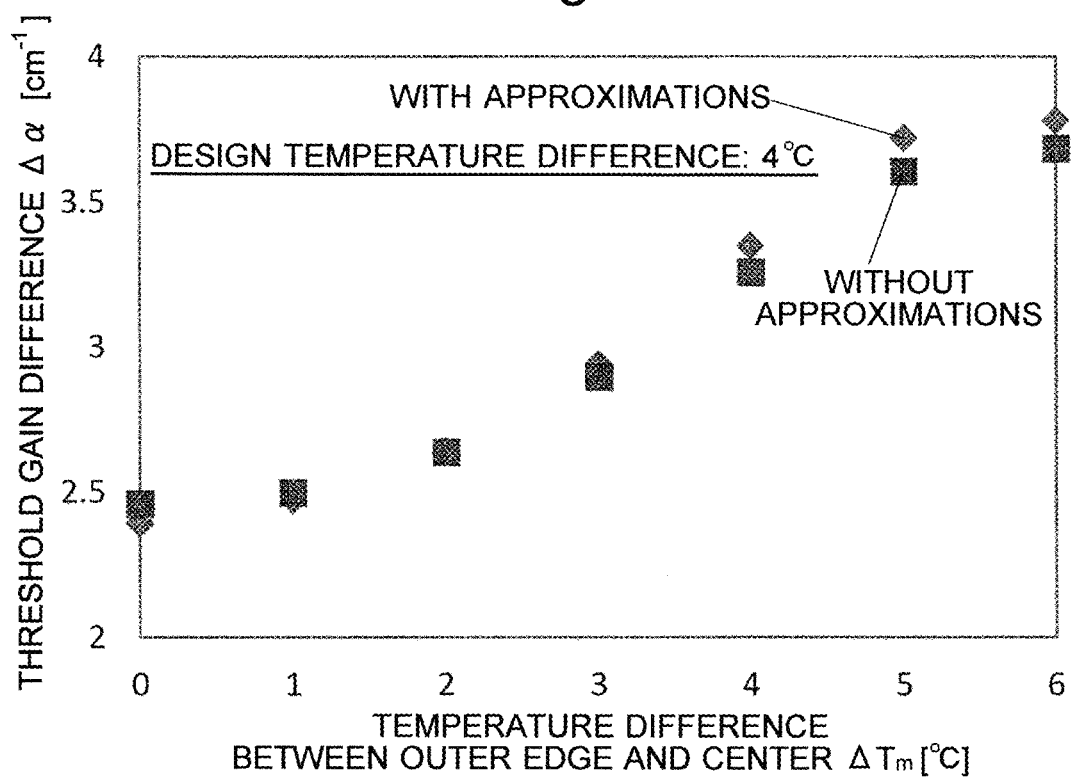
FIG. 8 is a graph showing the result of a simulation calculation of the value of a threshold gain difference with respect to the temperature difference between the center and the outer edge of the two-dimensional photonic crystal in the two-dimensional photonic-crystal surface-emitting laser according to the embodiment, where the calculation was performed with approximations in one case and without approximations in another case.

Several approximations have been made for the derivation of equations (1) and (2). In order to confirm that those approximations have only a minor effect, the threshold gain difference $\Delta\alpha$ has been calculated by simulation with the approximations as well as without the approximations. FIG. 8 shows the calculated result.

The present invention is not limited to the previous embodiment but allows for various modifications.

For example, the two-dimensional photonic-crystal layers 12 and 12A in the examples of FIGS. 3 and 6 are divided into five zones between the center and the outer edge. The number of zones may be increased (in which case the temperature difference between the neighboring zones becomes smaller) or decreased (in which case the temperature difference between the neighboring zones becomes larger). It is also possible to simultaneously vary both the in-plane occupancy and the lattice constant for each zone. Furthermore, the division into zones may be omitted (or the number of zones may be infinitely increased); i.e. the in-plane size (in-plane occupancy) of the neighboring modified refractive index areas 122 may be gradually decreased, or the spatial interval (lattice constant) of the neighboring lattice points may be gradually increased, in the direction from the center toward the outer edge of the two-dimensional photonic-crystal layer 12.

In the previous embodiment, either the in-plane occupancy or lattice constant is varied depending on the position. It is possible to vary both the in-plane occupancy and the lattice constant depending on the position.

In place of the holes used in the previous embodiment, members made of a material different from the base body 121 may be used as the modified refractive index areas. The planar shape of the modified refractive index areas may be variously changed, such as a circular, equilateral triangular, isosceles triangular or square shape in place of the right triangular shape in the previous embodiment. The arrangement pattern of the modified refractive index areas, which is a square lattice in the previous embodiment, may be changed to a triangular lattice, rectangular lattice or other appropriate patterns.

REFERENCE SIGNS LIST

10 . . . Two-Dimensional Photonic-Crystal Surface-Emitting Laser
11 . . . Active Layer
12, 12A . . . Two-Dimensional Photonic-Crystal Layer
121 . . . Base Body
122, 122A . . . Modified Refractive Index Area
1231-1235, 1231A-1235A . . . Zone in Which Modified Refractive Index Areas Having the Same In-Plane Occupancy and Lattice Constant Are Arranged
13 . . . Spacer Layer
141 . . . First Cladding Layer
142 . . . Second Cladding Layer
15 . . . First Electrode
16 . . . Second Electrode
21 . . . Current Passage Region

The invention claimed is:

1. A two-dimensional photonic-crystal surface-emitting laser including: a two-dimensional photonic crystal including a plate-shaped base body having a predetermined size in which modified refractive index areas whose refractive index differs from the base body are periodically arranged in a two-dimensional pattern; an active layer provided on one side of the two-dimensional photonic crystal; and a pair of electrodes facing each other across the two-dimensional photonic crystal and the active layer, for supplying an electric current to the active layer, wherein:
the modified refractive index areas are provided in such a manner that an in-plane occupancy of the modified refractive index areas in the base body increases in a direction from an outer edge toward a center of a current passage region which is a region where the electric current passes through the two-dimensional photonic crystal.

2. The two-dimensional photonic-crystal surface-emitting laser according to claim 1, wherein a difference $\Delta f(x, y)$ between the in-plane occupancy $f(x, y)$ at any in-plane position within the current passage region and the in-plane occupancy $f_b$ at the outer edge, i.e. $\Delta f(x, y)=f(x, y)-f_b$, is proportional to a difference $\Delta T(x, y)$ between a temperature $T(x, y)$ at the in-plane position concerned and the temperature $T_b$ at the outer edge, i.e. $\Delta T(x, y)=T(x, y)-T_b$ ($>0$), with a positive proportionality coefficient.

3. The two-dimensional photonic-crystal surface-emitting laser according claim 1, wherein the modified refractive index areas are provided in such a manner that the in-plane occupancy concentrically decreases from the center of the current passage region.

4. A two-dimensional photonic-crystal surface-emitting laser including: a two-dimensional photonic crystal including a plate-shaped base body having a predetermined size in which modified refractive index areas whose refractive index differs from the base body are periodically arranged in a two-dimensional lattice pattern; an active layer provided on one side of the two-dimensional photonic crystal; and a pair of electrodes facing each other across the two-dimensional photonic crystal and the active layer, for supplying an electric current to the active layer, wherein:
the modified refractive index areas are arranged in such a manner that a lattice constant decreases in a direction from an outer edge toward a center of a current passage region which is a region where the electric current passes through the two-dimensional photonic crystal.

5. The two-dimensional photonic-crystal surface-emitting laser according to claim 4, wherein a difference $\Delta a(x, y)$ between the lattice constant $a(x, y)$ at any in-plane position within the current passage region and the lattice constant $a_b$ at the outer edge, i.e. $\Delta a(x, y)=a(x, y)-a_b$, is proportional to a difference $\Delta T(x, y)$ between a temperature $T(x, y)$ at the in-plane position concerned and the temperature $T_b$ at the outer edge, $\Delta T(x, y)=T(x, y)-T_b$ ($>0$), with a negative proportionality coefficient.

6. The two-dimensional photonic-crystal surface-emitting laser according to claim 4, wherein the modified refractive index areas are provided in such a manner that the lattice constant concentrically increases from the center of the current passage region.

7. The two-dimensional photonic-crystal surface-emitting laser according to claim 2, wherein the modified refractive index areas are provided in such a manner that the in-plane occupancy concentrically decreases from the center of the current passage region.

8. The two-dimensional photonic-crystal surface-emitting laser according to claim 5 wherein the modified refractive index areas are provided in such a manner that the lattice constant concentrically increases from the center of the current passage region.

* * * * *